(12) United States Patent
Tian et al.

(10) Patent No.: US 12,015,022 B2
(45) Date of Patent: Jun. 18, 2024

(54) DISPLAY PANEL AND METHOD FOR MANUFACTURING THE SAME, DISPLAY DEVICE

(71) Applicant: BOE TECHNOLOGY GROUP CO., LTD., Beijing (CN)

(72) Inventors: Yu Tian, Beijing (CN); Qian Jin, Beijing (CN); Qian Sun, Beijing (CN); Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 17/358,235

(22) Filed: Jun. 25, 2021

(65) Prior Publication Data
US 2021/0407977 A1 Dec. 30, 2021

(30) Foreign Application Priority Data
Jun. 29, 2020 (CN) .......................... 202010606487.3

(51) Int. Cl.
*H01L 25/16* (2023.01)
*H01L 25/075* (2006.01)
(Continued)

(52) U.S. Cl.
CPC ........ *H01L 25/167* (2013.01); *H01L 27/1248* (2013.01); *H01L 33/507* (2013.01);
(Continued)

(58) Field of Classification Search
CPC ................ H01L 25/167; H01L 25/187; H01L 2933/0058; H01L 27/1248; H01L 33/58;
(Continued)

(56) References Cited

U.S. PATENT DOCUMENTS 10,090,335 B2 * 10/2018 Kang .................... H01L 33/505
10,424,632 B2 9/2019 Nakamura
(Continued)

FOREIGN PATENT DOCUMENTS

CN 107863448 A 3/2018
CN 108666408 A 10/2018
(Continued)

OTHER PUBLICATIONS

China Patent Office, First Office Action dated Mar. 23, 2021, for corresponding Chinese application No. 202010606487.3.

*Primary Examiner* — Walter H Swanson
*Assistant Examiner* — Jacob T Nelson
(74) *Attorney, Agent, or Firm* — HOUTTEMAN LAW LLC

(57) ABSTRACT

The present disclosure provides a display panel, a method for manufacturing a display panel and a display device. The display panel includes a substrate, and a light emitting element array and a quantum dot color filter array arranged on the substrate, the quantum dot color filter array is arranged on a light exiting side of the light emitting element array, and quantum dot color filters in the quantum dot color filter array correspond to light emitting elements in the light emitting element array one to one, and the display panel further includes a blocking structure arranged between the light emitting element array and the quantum dot color filter array so as to block heat dissipated by the light emitting elements from being conducted to the quantum dot color filters.

17 Claims, 1 Drawing Sheet

(51) Int. Cl.
*H01L 27/12* (2006.01)
*H01L 33/50* (2010.01)
*H01L 33/56* (2010.01)
*H01L 33/58* (2010.01)
*H01L 33/64* (2010.01)

(52) U.S. Cl.
CPC .............. *H01L 33/56* (2013.01); *H01L 33/58* (2013.01); *H01L 33/641* (2013.01); *H01L 2933/0041* (2013.01); *H01L 2933/005* (2013.01); *H01L 2933/0058* (2013.01)

(58) Field of Classification Search
CPC ....... H01L 33/56; H01L 33/64; H01L 33/641; H01L 33/505; H01L 33/507
See application file for complete search history.

(56) References Cited

U.S. PATENT DOCUMENTS

| | | | |
|---|---|---|---|
| 10,553,660 B2* | 2/2020 | Kim | H01L 27/1248 |
| 2016/0181310 A1* | 6/2016 | Pitts | H04N 13/229 |
| | | | 438/69 |
| 2016/0238748 A1* | 8/2016 | Lee | H10K 50/15 |
| 2017/0133357 A1* | 5/2017 | Kuo | H01L 25/167 |
| 2019/0123306 A1 | 4/2019 | Liang et al. | |
| 2019/0371866 A1* | 12/2019 | Kim | H10K 50/858 |

FOREIGN PATENT DOCUMENTS

| | | |
|---|---|---|
| CN | 109817695 A | 5/2019 |
| CN | 110854256 A1 | 2/2020 |

\* cited by examiner

DISPLAY PANEL AND METHOD FOR MANUFACTURING THE SAME, DISPLAY DEVICE

CROSS-REFERENCE TO RELATED APPLICATIONS

The present application claims the priority of Chinese Patent Application NO. 202010606487.3, filed on Jun. 29, 2020, the contents of which are incorporated herein in their entirety by reference.

TECHNICAL FIELD

The present disclosure relates to the field of display technology, and particularly relates to a display panel, a method for manufacturing a display panel and a display device.

BACKGROUND

MicroLED (Micro light emitting diode) display panels are implemented by using an array of micron-sized LEDs, applications of which include smart watch/smartphone displays, tablet computers, notebook computers, displays, televisions, and NEDs (near-eye displays) such as AR/VR (augmented reality/virtual reality). However, limited by problems of complicated process flow and low transferring yield, the MicroLED display panels have a high overall production cost.

At present, purposes of simplifying the process flow, improving the yield and reducing the production cost are achieved by integrating a single blue light MicroLED and a quantum dot (QD) color conversion layer. However, in current MicroLED display panels, a working temperature of the MicroLED ranges from 80° C. to 120° C., and such high temperature greatly affects a service life and a light conversion efficiency of the quantum dot color conversion layer, which may cause an overall reliability (service life and color conversion efficiency) of the quantum dot color conversion layer to decrease.

SUMMARY

The present disclosure provides a display panel, including a substrate, and a light emitting element array and a quantum dot color filter array disposed on the substrate, where the quantum dot color filter array is located on a light exiting side of the light emitting element array, and quantum dot color filters in the quantum dot color filter array correspond to light emitting elements in the light emitting element array one to one; the display panel further includes a blocking structure, and the blocking structure is arranged between the light emitting element array and the quantum dot color filter array so as to block heat dissipated by the light emitting elements from being conducted to the quantum dot color filters.

In some implementations, the blocking structure includes a first planarization layer and a second planarization layer, the first planarization layer and the second planarization layer are sequentially stacked on the substrate along a light exiting direction of the light emitting element array, and the second planarization layer is located on a side of the light emitting element array away from the substrate;
    a heat conductivity of the first planarization layer is higher than a heat conductivity of the second planarization layer; or, the heat conductivity of the first planarization layer is substantially equal to the heat conductivity of the second planarization layer.

In some implementations, the light emitting element array is embedded in the first planarization layer, and a surface of the first planarization layer away from the substrate is flush with a surface at the light exiting side of the light emitting element array away from the substrate;
    Or, the surface of the first planarization layer away from the substrate is higher than the surface at the light exiting side of the light emitting element array away from the substrate.

In some implementations, the blocking structure further includes a micro-lens array embedded in the second planarization layer, and a farthest end of the micro-lens array from the light exiting side of the light emitting element array is flush with a surface of the second planarization layer away from the light exiting side of the light emitting element array;
    micro-lenses in the micro-lens array correspond to the light emitting elements in the light emitting element array one to one.

In some implementations, the first planarization layer is made of a transparent epoxy resin material or heat-conducting silica gel material, and the second planarization layer is made of a transparent polypropylene block polymer material;
    a heat conductivity of the epoxy resin material ranges from 0.2 W/(m·K) to 2.2 W/(m·K); a heat conductivity of the heat-conducting silica gel material ranges from 0.8 W/(m·K) to 3.0 W/(m·K); and a heat conductivity of the polypropylene block polymer material ranges from 0.14 W/(m·K) to 0.25 W/(m·K).

In some implementations, the first and second planarization layers each employ a transparent polypropylene block polymer material;
    a heat conductivity of the polypropylene block polymer material ranges from 0.14 W/(m·K) to 0.25 W/(m·K).

In some implementations, each of the micro-lenses includes a first part and a second part, and the second part covers a side of the first part away from the light exiting side of the light emitting element array;
    the second part has a refractive index greater than that of the first part; and the first part has a refractive index greater than 1.

In some implementations, the first part has a refractive index ranging from 1.4 to 1.6.

In some implementations, the second part has a refractive index ranging from 1.7 to 2.1.

In some implementations, the display panel further includes a light blocking layer disposed on the second planarization layer, the light blocking layer is located in a spacing region between adjacent ones of the quantum dot color filters, and a surface of the light blocking layer away from the light exiting side of the light emitting element array is flush with surfaces of the quantum dot color filters away from the light exiting side of the light emitting element array.

In some implementations, the display panel further includes a light blocking layer disposed on the first planarization layer, the light blocking layer is located in a spacing region between adjacent ones of the quantum dot color filters, and a surface of the light blocking layer away from the light exiting side of the light emitting element array is flush with surfaces of the quantum dot color filters away from the light exiting side of the light emitting element array.

In some implementations, the display panel further includes a protective layer disposed on a side of the quantum dot color filter array away from the light exiting side of the light emitting element array, and the protective layer covers the quantum dot color filter array and the light blocking layer.

In some implementations, the display panel further includes a color filter layer array and an encapsulation layer, the color filter layer array is disposed on a side of the protective layer away from the light exiting side of the light emitting element array, and color filter layers in the color filter layer array correspond to the light emitting elements in the light emitting element array one to one;

the encapsulation layer is arranged on a side, away from the light exiting side of the light emitting element array, of the color filter layer array, and covers the color filter layer array.

The present disclosure further provides a display device including the display panel described above.

The present disclosure further provides a method for manufacturing a display panel, including: sequentially forming a light emitting element array and a quantum dot color filter array on a substrate, where the quantum dot color filter array is arranged on a light exiting side of the light emitting element array, and quantum dot color filters in the quantum dot color filter array correspond to light emitting elements in the light emitting element array one to one; after forming the light emitting element array and before forming the quantum dot color filter array, forming a blocking structure between the light emitting element array and the quantum dot color filter array, and the blocking structure blocks heat dissipated by the light emitting elements from being conducted to the quantum dot color filters.

In some implementations, the forming the blocking structure includes: sequentially forming a first planarization layer, a micro-lens array and a second planarization layer on the light exiting side of the light emitting element array.

In some implementations, forming the first planarization layer includes:
forming the first planarization layer by adopting a transparent heat-conducting material with a heat conductivity ranging from 0.2 W/(m·K) to 3.0 W/(m·K) through a spin coating or suspension coating process, so that a height difference between the light emitting elements and the substrate is eliminated.

In some implementations, the forming the first planarization layer includes:
forming the first planarization layer by adopting a transparent heat-conducting material with a heat conductivity ranging from 0.14 W/(m·K) to 0.25 W/(m·K) through a spin coating or suspension coating process, so that a height difference between the light emitting elements and the substrate is eliminated.

In some implementations, the forming the micro-lens array includes:
forming a first part of the micro-lens by ink-jet printing, and curing the first part by a high temperature or UV light; and
forming a second part of the micro-lens on the first part by printing or chemical vapor deposition.

In some implementations, forming the second planarization layer includes:
forming the second planarization layer by adopting a transparent heat-conducting material with a heat conductivity ranging from 0.14 W/(m·K) to 0.25 W/(m·K) through a spin coating or suspension coating process, so that a height difference between the micro-lenses and the first planarization layer.

DESCRIPTION OF EMBODIMENTS

In order to make those skilled in the art better understand technical solutions of the present disclosure, a display panel, a method for manufacturing a display panel, and a display device according to embodiments of the present disclosure are described in further detail below with reference to the accompanying drawings and the detailed description.

In the related art, quantum dot color conversion layers may be directly coated on a cover plate, the quantum dot color conversion layers are arranged in an array, and the quantum dot color conversion layers correspond to MicroLED sub-pixels arranged in an array one to one, and the cover plate and a substrate where the MicroLED sub-pixels are aligned and assembled into a cell of an enclosed structure. The cell with the enclosed structure is sealed, an actual working temperature of the MicroLED ranges from 80° C. to 120° C., and such high temperature greatly affects a service life and a color conversion efficiency of the quantum dot color conversion layers.

In the related art, the quantum dot color conversion layer may also be directly manufactured on an LED chip.

However, a problem of decrease in an overall reliability (service life, color conversion efficiency) of the quantum dot color conversion layer due to heat dissipated by the LED is ignored in the related art.

Figure 1:
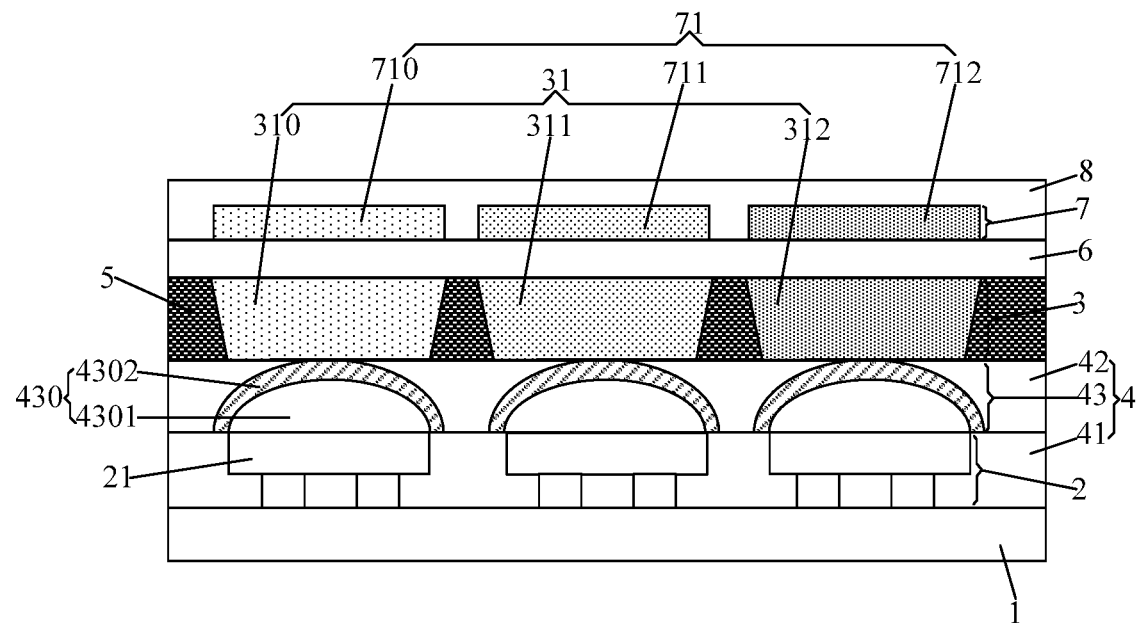
FIG. 1 is a schematic cross-sectional view of a display panel according to an embodiment of the disclosure.

In view of the above problem that the high temperature due to the MicroLED operating affects the service life of the quantum dot color conversion layer and the color conversion efficiency, an embodiment of the present disclosure provides a display panel, and as shown in FIG. 1, the display panel includes a substrate 1, a light emitting element array 2 and a quantum dot color filter array 3 on the substrate 1, where the quantum dot color filter array 3 is located on a light exiting side of the light emitting element array 2, and quantum dot color filters 31 in the quantum dot color filter array 3 correspond to light emitting elements 21 in the light emitting element array 2 one to one. The display panel further includes a blocking structure 4, and the blocking structure 4 is disposed between the light emitting element array 2 and the quantum dot color filter array 3 to block heat dissipated by the light emitting elements 21 from being conducted to the quantum dot color filters 31.

Orthographic projections of the quantum dot color filters 31 on the substrate 1 cover orthographic projections of the light emitting elements 21 on the substrate 1. The light emitting elements 21 may be blue light MicroLEDs. The light emitting elements 21 may be LEDs or the like. The quantum dot color filters 31 include a red quantum dot color filter 310, a green quantum dot color filter 311 and a transparent resin color filter 312, blue light emitted by the blue light MicroLEDs can be converted into red light by quantum dots in the red quantum dot color filter 310, blue light emitted by the blue light MicroLEDs can be converted into green light by quantum dots in the green quantum dot color filter 311, scattering particles are filled in the transparent resin color filter 312, blue light emitted by the blue light MicroLEDs can penetrate through the transparent resin color filter 312, and therefore color display of the blue light MicroLED display panel is achieved. The substrate 1 includes driving circuits for driving the light emitting elements 21 to emit light, the driving circuit of each light emitting element 21 includes one or more transistors; the driving circuit of each light emitting element 21 is configured to control and drive the corresponding light emitting element 21 to emit light. The driving circuits of the light emitting elements 21 may be relatively mature circuits, which are not described in detail herein.

According to the display panel disclosed by the embodiment of the present disclosure, the blocking structure 4 is arranged between the light emitting element array 2 and the quantum dot color filter array 3, so that heat dissipated by the light emitting elements 21 can be blocked from being conducted to the quantum dot color filters 31, thereby improving or avoiding the great influence of the working temperature of the light emitting elements 21 on the service life and the color conversion efficiency of the quantum dot color filters 31, further improving or avoiding a reduction of the overall reliability (such as the service life and the color conversion efficiency) of the quantum dot color filters 31 caused by the heat dissipated by the light emitting elements 21, and improving a quality of the display panel.

In some implementations, the blocking structure 4 includes a first planarization layer 41 and a second planarization layer 42, the first planarization layer 41 and the second planarization layer 42 are sequentially stacked on the substrate 1 along a light exiting direction of the light emitting element array 2, and the second planarization layer 42 is located on a side of the light emitting element array 2 away from the substrate 1; a heat conductivity of the first planarization layer 41 is higher than that of the second planarization layer 42. The heat dissipated by the light emitting elements 21 operating is conducted to periphery including upper, lower, left, and right, during the heat being conducted to the light exiting side of the light emitting elements 21, the heat is first conducted to the first planarization layer 41, since the heat conductivity of the second planarization layer 42 at the side of the first planarization layer 41 away from the light emitting element array 2 is relatively low, the heat in the first planarization layer 41 is not easily conducted to the second planarization layer 42, most of the heat is conducted in a transverse direction through the first planarization layer 41 and conducted to a direction where the substrate 1 is located, and driving circuits are disposed in the substrate 1, and the driving circuits include metal conductive wires or elements with a relatively high heat conductivity and a high heat conduction speed, and thus most of the heat is conducted to a side where the substrate 1 is located, the heat conducted to a side where the quantum dot color filters 31 are located is greatly reduced, and the great influence of the heat dissipated by the light emitting elements 21 on the service life and the color conversion efficiency of the quantum dot color filters 31 is further improved or avoided, the reliability of the quantum dot color filters 31 is improved, and the quality of the display panel is improved.

In some implementations, the light emitting element array 2 is embedded in the first planarization layer 41, and a surface of the first planarization layer 41 away from the substrate 1 is flush with a surface of the light exiting side of the light emitting element array 2 away from the substrate 1.

The first planarization layer 41 eliminates a height difference (i.e., a distance between surfaces of the light emitting elements 21 away from the substrate 1 and a surface of the substrate 1 proximal to the light emitting elements 21) formed by disposing the light emitting elements 21 on the substrate 1. It should be noted that the surface of the first planarization layer 41 away from the substrate 1 may also be higher than the surface of the light exiting side of the light emitting element array 2 away from the substrate 1, which is more favorable for forming subsequent film layers on a relatively flat surface.

In some implementations, the first planarization layer 41 may be made of a transparent epoxy resin material or a heat-conducting silica gel material, and the second planarization layer 42 may be made of a transparent polypropylene block polymer material; a heat conductivity of the epoxy resin material ranges from 0.2 W/(m·K) to 2.2 W/(m·K); a heat conductivity of the heat-conducting silica gel material ranges from 0.8 W/(m·K) to 3.0 W/(m·K); a heat conductivity of the polypropylene block polymer material ranges from 0.14 W/(m·K) to 0.25 W/(m·K). That is to say, the first planarization layer 41 has a certain heat conductivity, and the second planarization layer 42 has a certain heat-insulating and heat blocking performance relative to the first planarization layer 41, so that the heat dissipated by the light emitting elements 21 can be prevented from greatly affecting the service life and color conversion efficiency of the quantum dot color filters 31, and the reliability of the quantum dot color filters 31 is improved.

Note that, the heat conductivity of the first planarization layer 41 may be equal to the heat conductivity of the second planarization layer 42. The heat blocking principle with such configuration is as follows: the first planarization layer 41 and the second planarization layer 42 may both be made of a material with a low heat conductivity, so that most of the heat dissipated by the light emitting elements 21 is blocked by the first planarization layer 41 and the second planarization layer 42, and is not easily conducted to the side where the quantum dot color filters 31 are located, but is conducted to the side where the substrate 1 with a relatively good heat conductivity is located, thereby improving or avoiding the heat dissipated by the light emitting elements 21 from affecting the service life and the color conversion efficiency of the quantum dot color filters 31.

In some implementations, the first planarization layer 41 and the second planarization layer 42 may both be made of a transparent polypropylene block polymer material; a heat conductivity of the polypropylene block polymer material ranges from 0.14 W/(m·K) to 0.25 W/(m·K). That is to say, the first planarization layer 41 and the second planarization layer 42 may both have certain heat-insulating and heat blocking properties, so that most of the heat dissipated by the light emitting elements 21 is conducted to the substrate 1, thereby improving or avoiding the heat dissipated by the light emitting elements 21 from greatly affecting the service life and color conversion efficiency of the quantum dot color filters 31, and improving the reliability of the quantum dot color filters 31.

In some implementations, the blocking structure 4 may further include a micro-lens array 43, the micro-lens array 43 is embedded in the second planarization layer 42, and a farthest end of the micro-lens array 43 from the light exiting side of the light emitting element array 2 is flush with a surface of the second planarization layer 42 away from the light exiting side of the light emitting element array 2; such arrangement is favorable for forming the quantum dot color filter array 3 on a relatively flat surface; micro-lenses 430 in the micro-lens array 43 correspond one-to-one to the light emitting elements 21 in the light emitting element array 2. With such arrangement of the micro-lenses 430, a distance between the light emitting elements 21 and the quantum dot color filters 31 is further increased, so that the heat dissipated by the light emitting elements 21 being conducted to the quantum dot color filters 31 can be further reduced, and further, the influence of the heat dissipated by the light emitting elements 21 on the service life and the color conversion efficiency of the quantum dot color filters 31 is further improved.

In addition, since a refractive index of a surface layer at the light exiting side of the light emitting elements 21 (e.g., MicroLEDs) is relatively large (e.g., 2.6), and a refractive index of air is relatively small (e.g., 1), and a difference between such two refractive indexes is relatively large, when light is emitted from inside of the light emitting elements 21 to the air, about 75% to 80% of the light will be totally reflected inside the light emitting elements 21 and cannot be emitted to the air, and only the remaining part of light (15% to 20%) enters the air, which results in a low light extraction rate of the light emitting elements 21, and a display brightness of the display panel cannot meet requirements. By providing the micro-lenses 430 at the light exiting side of light emitting elements 21, the light emitted by the light emitting elements 21 are converged through the micro-lenses 430 and then enters the air, which can improve the light extraction rate of the light emitting elements 21, and a concrete principle is: according to a formula $n_1 \cdot \sin \theta_1 = n_2 \cdot \sin \theta_2$; where n1 and n2 are refractive indexes of two kinds of light propagation medium, the medium with the larger refractive index is an optically dense medium, and the medium with the smaller refractive index is an optically sparse medium; θ1 and θ2 are incident and exit angles of light, respectively; since products at two sides of the formula are equal to each other, for each side of the formula, the refractive index n is larger, the corresponding θ is smaller; when the light is transmitted from the optically dense medium to the optically sparse medium, the light exit angle is larger than the light incident angle and the light is diverged; when the light is transmitted from the light sparse medium to the light dense medium, the light exit angle is smaller than the light incident angle, and the light is converged. Since the refractive index of the micro-lenses 430 is greater than that of air, compared with a case where the light emitted by the light emitting elements 21 directly exits into the air, a total reflection amount of the light can be greatly reduced, and an amount of the light exiting from the surface layer at the light exiting side of the light emitting elements 21 to the micro-lenses 430 is significantly greater than an amount of the light exiting from the surface layer at the light exiting side of the light emitting elements 21 to the air, so that the light extraction rate of the light emitting elements 21 is improved, and the display brightness and the display effect of the display panel are improved.

Orthographic projections of the micro-lenses 430 on the substrate 1 coincide with the orthographic projections of the light emitting elements 21 on the substrate 1. Certainly, the orthographic projections of the micro-lenses 430 on the substrate 1 may partially overlap the orthographic projections of the light emitting elements 21 on the substrate 1, and as long as all the light emitted from the light emitting elements 21 passes through the micro-lenses 430 to emit and the light extraction rate of the light emitting element 21 is improved. The micro-lenses 430 may be convex lenses, and a convex surface of each convex lens is located on a side of the convex lens away from the light exiting side of the light emitting elements 21. In an aspect, the micro-lenses 430 can prevent the light emitted from the light emitting elements 21 to the surface layer at the light exiting side thereof from being totally reflected inside the light emitting elements 21, so that most of the light is emitted from the surface layer at the light exiting side of the light emitting elements 21 to the micro-lenses 430, thereby improving the light extraction rate of the light emitting elements 21; in another aspect, the light emitted from the micro-lenses 430 can be converged, thereby improving the emission brightness of the light emitting elements 21.

In some implementations, each of the micro-lenses 430 includes a first part 4301 and a second part 4302, and the second part 4302 covers a side of the first part 4301 away from the light exiting side of the light emitting element array 2; a refractive index of the second part 4302 is greater than a refractive index of the first part 4301; the first part 4301 has a refractive index greater than 1. Based on a principle that light is converged when being transmitted from the optically sparse medium to the optically denser medium, the light is converged when being transmitted from the first part 4301 to the second part 4302, so that the light passing through the micro-lenses 430 is transmitted to the quantum dot color filters 31 in a more converging manner, and thus the amount of the light transmitted to the quantum dot color filters 31 is significantly increased, through the conversion of the quantum dot color filters 31 on the color of the light, the amount of light with different colors, converted and output by the quantum dot color filters 31 is further increased, and since the refractive index of the first part 4301 is greater than 1, the light extraction rate of the light emitting elements 21 can be increased, and further the display brightness and the display effect of the display panel are improved.

An aperture (a size in a direction parallel to a plane of the substrate 1) of each of the micro-lenses 430 ranges from 40 μm to 60 μm, a height (a size in a direction perpendicular to the plane of the substrate 1) of each of the micro-lenses 430 ranges from 4 μm to 10 μm, and a focal length of each of the micro-lenses 430 ranges from 20 μm to 25 μm. The second part 4302 is deposited by an atomic layer deposition (ALD) method to have a thickness (a size in a direction perpendicular to the plane of the substrate 1) of about 1.0 μm to 3.0 μm. Since the micro-lenses 430 are convex lenses, no matter how size parameters (such as height, focal length, etc.) of the convex lenses are set, the micro-lenses 430 can converge the light incident therein to a certain extent, so as to increase a total amount of light entering pupils of human's eyes, and further increase the emission brightness of the light emitting elements 21.

In some implementations, the first part 4301 has a refractive index ranging from 1.4 to 1.6, and the second part 4302 has a refractive index ranging from 1.7 to 2.1.

In some implementations, the display panel may further include a light blocking layer 5, the light blocking layer 5 is disposed on the second planarization layer 42, the light blocking layer 5 is located in an interval region between adjacent quantum dot color filters 31, and a surface of the light blocking layer 5 away from the light exiting side of the light emitting element array 2 is flush with surfaces of the quantum dot color filters 31 away from the light exiting side of the light emitting element array 2. Such arrangement is favorable to form subsequent film layers on a relatively flat surface. The light blocking layer 5 can prevent color crosstalk between adjacent light emitting elements 21, thereby improving the display effect of the display panel.

A cross section of the light blocking layer 5 perpendicular to the substrate 1 is in a regular trapezoid shape or a rectangular shape, but the embodiment of the present disclosure is not limited thereto, and the specific shape of the cross section of the light blocking layer 5 perpendicular to the substrate 1 is determined by a manufacturing process and is not described herein again.

Figure 2:
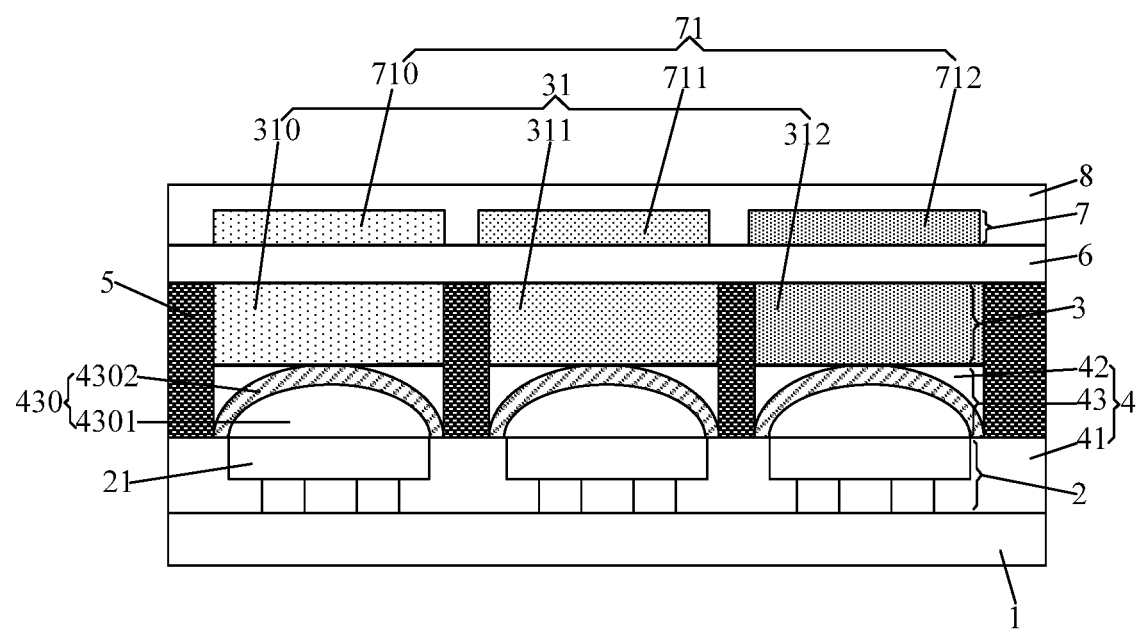
FIG. 2 is a schematic cross-sectional view of another structure of a display panel according to an embodiment of the disclosure.

As shown in FIG. 2, the light blocking layer 5 may further be disposed on the first planarization layer 41, and the light blocking layer 5 is located in an interval region between adjacent quantum dot color filters 31, where a surface of the light blocking layer 5 away from the light exiting side of the light emitting element array 2 is flush with surfaces of the quantum dot color filters 31 away from the light exiting side of the light emitting element array 2. Such arrangement is favorable to form subsequent film layers on a relatively flat surface, and the light blocking layer 5 in such arrangement can avoid color crosstalk between the adjacent light emitting elements 21, thereby improving the display effect of the display panel.

In some implementations, the display panel may further include a protective layer 6, the protective layer 6 is disposed on a side of the quantum dot color filter array 3 away from the light exiting side of the light emitting element array 2, and the protective layer 6 covers the quantum dot color filter array 3 and the light blocking layer 5. The protective layer 6 is made of a single-layer inorganic material film, such as silicon nitride or silicon oxide, or the protective layer 6 is made of a laminated layer of an organic material film and an inorganic material film, and the protective layer 6 can prevent external water vapor from entering the quantum dot color filters 31, so that the light color conversion performance of the quantum dot color filters 31 is prevented from being damaged by the external water vapor.

In some implementations, the display panel may further include a color filter array 7 and an encapsulation layer 8, the color filter array 7 is disposed on a side of the protective layer 6 away from the light exiting side of the light emitting element array 2, and color filter layers 71 in the color filter array 7 correspond to the light emitting elements 21 in the light emitting element array 2 one to one; the encapsulation layer 8 is disposed on a side of the color filter array 7 away from the light exiting side of the light emitting element array 2, and the encapsulation layer 8 covers the color filter array 7. The color filter layers 71 include a red color filter layer 710, a green color filter layer 711 and a blue color filter layer 712, where the red color filter layer 710 corresponds to the red quantum dot color filter 310; the green color filter layer 711 corresponds to the green quantum dot color filter 311; the blue color filter layer 712 corresponds to the transparent resin color filter 312; the color filter layers 71 can further perform color filtering on corresponding color light converted by the quantum dot color filters 31, so that the purity of the color light is higher, the color saturation is better, and the color display effect of the display panel is improved. The encapsulation layer 8 can further encapsulate the display panel provided with the color filter layers 71, and each film layer inside the display panel is prevented from being damaged by external factors.

In addition, the encapsulation layer 8 may be a single film layer of an inorganic material, such as silicon nitride or silicon oxide, or the encapsulation layer 8 may be a laminated layer of an organic material film and an inorganic material film.

Based on the display panel with the structure described above, an embodiment of the present disclosure further provides a method for manufacturing a display panel, which includes: sequentially forming a light emitting element array and a quantum dot color filter array on a substrate, where the quantum dot color filter array is positioned on a light exiting side of the light emitting element array, and quantum dot color filters in the quantum dot color filter array correspond to light emitting elements in the light emitting element array one to one; and after forming the light emitting element array and before forming the quantum dot color filter array, forming a blocking structure between the light emitting element array and the quantum dot color filter array, so that heat dissipated by the light emitting elements can be prevented from being conducted to the quantum dot color filters.

In the embodiment of the present disclosure, the forming the blocking structure includes: sequentially forming a first planarization layer, a micro-lens array and a second planarization layer on the light exiting side of the light emitting element array.

In the embodiment of the present disclosure, a specific manufacturing process of the display panel is as follows.

1) After the substrate is subjected to a driving circuit array process, transferring of light emitting elements (such as blue light MicroLEDs) is performed to form a light emitting element array.

2) A first planarization layer is formed. The first planarization layer is formed by a spin coating or suspension coating process using a transparent heat-conducting material (such as an organic resin material) with a heat conductivity within a preset range (such as from 0.2 W/(m·K) to 3.0 W/(m·K), or from 0.14 W/(m·K) to 0.25 W/(m·K), where a thickness (a dimension along a direction vertical to a plane of the substrate) of the first planarization layer at least reaches a height (a dimension along the direction vertical to the plane of the substrate) of the light emitting elements with respect to the substrate, so as to eliminate a height difference between the light emitting elements and the substrate, and thus a subsequent film layer can be formed on a relatively flat surface; and then, an exposure process is performed on the first planarization layer by using an open mask to cure the first planarization layer.

3) A micro-lens array is formed on a side of the first planarization layer away from the light emitting element array: first, a first part of each micro-lens is formed by ink-jet printing and cured by a high temperature or UV light.

4) A material of a second part is deposited on the first part by printing or chemical vapor deposition to form the second part of each micro-lens.

5) A second planarization layer is formed. the second planarization layer is formed by a spin coating or a suspension coating process using a transparent heat conductive material (e.g., an organic polymer material) having a heat conductivity in a preset range (e.g., from 0.14 W/(m·K) to 0.25 W/(m·K)) and has a thickness (a dimension in a direction perpendicular to the plane of the substrate) just enough to fill a height difference (i.e., a distance between a surface of the micro-lenses away from the first planarization layer and a surface of the first planarization layer proximal to the micro-lenses) caused by the formation of the micro-lenses on the first planarization layer.

6) A light blocking layer is formed on the second planarization layer. The light blocking layer is made of an opaque resin material, and a pattern of the light blocking layer can be formed through processes of spin coating, exposure and development.

7) The quantum dot color filter array is formed by an ink-jet printing or spin coating method.

If the quantum dot color filter array is formed by the ink-jet printing method, red, green and transparent quantum dot color filters are respectively formed by three ink-jet printing processes. If the quantum dot color filter is formed by the spin coating method, quantum dot color filter layers of a color need to be formed by spin coating, and then a mask plate with a quantum dot color filter pattern is used for exposure and development to form a pattern of the quantum dot color filters with the color; and then patterns of the quantum dot color filters with other two colors are formed according to the same method.

8) A protective layer is formed. The protective layer is formed by adopting a chemical vapor deposition method or spin coating.

9) A color filter layer array is formed.

The method for forming the color filter layer array includes: performing a spin coating to form a color filter layer film of a color, and then adopting a mask plate with a color filter layer pattern to expose and develop the color filter layer film of the color to form the color filter layer pattern of the color; then, color filter layers of other two colors are formed in the same manner.

10) an encapsulation layer is formed. The encapsulation layer is formed by adopting a chemical vapor deposition method or spin coating.

It should be noted that the method for forming the light blocking layer on the first planarization layer is the same as the method for forming the light blocking layer on the second planarization layer in the above method, but an order of forming the film layers is different, and the description is omitted here.

The forming of the film layers in the display panel according to the embodiment of the present disclosure may adopt a relatively mature process, which is not described herein again.

By using the method for manufacturing the display panel according to the embodiment of the present disclosure, the process flow is simple, the manufacturing cost of the display panel is low, and the manufacturing yield of the display panel can be ensured.

In the display panel manufactured by the method disclosed by the embodiment of the present disclosure, the blocking structure is arranged between the light emitting element array and the quantum dot color filter array, so that heat dissipated by the light emitting elements can be blocked from being conducted to the quantum dot color filters, and thus, the great influence of the working temperature of the light emitting elements on the service life and the color conversion efficiency of the quantum dot color filters is improved or avoided, the reduction of the overall reliability (such as the service life and the color conversion efficiency) of the quantum dot color filters caused by the heat dissipated by the light emitting elements is further improved or avoided, and the quality of the display panel is improved.

An embodiment of the present disclosure further provides a display device, which includes the display panel in the above embodiment.

By adopting the display panel in the embodiment of the present disclosure, the reliability and the quality of the display device are improved.

The display device provided by the embodiment of the present disclosure may be any product or component with a display function, such as a MicroLED panel, a MicroLED television, an LED panel, an LED television, a display, a mobile phone, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display panel, comprising a substrate, and a light emitting element array and a quantum dot color filter array on the substrate, the quantum dot color filter array is arranged on a light exiting side of the light emitting element array, and quantum dot color filters in the quantum dot color filter array correspond to light emitting elements in the light emitting element array one to one,
the display panel further comprises a blocking structure arranged between the light emitting element array and the quantum dot color filter array so as to prevent heat dissipated by the light emitting elements from being conducted to the quantum dot color filters,
wherein the blocking structure comprises a first planarization layer and a second planarization layer, the first planarization layer and the second planarization layer are sequentially stacked on the substrate along a light exiting direction of the light emitting element array, and the second planarization layer is located on a side of the light emitting element array away from the substrate,
the light emitting element array is embedded in the first planarization layer, and a surface of the first planarization layer away from the substrate is flushed with a surface at the light exiting side of the light emitting element array away from the substrate.

2. The display panel according to claim 1, wherein a heat conductivity of the first planarization layer is higher than a heat conductivity of the second planarization layer; or, the heat conductivity of the first planarization layer is equal to the heat conductivity of the second planarization layer.

3. The display panel according to claim 1, wherein the blocking structure further comprises a micro-lens array embedded in the second planarization layer, and a farthest end of the micro-lens array from the light exiting side of the light emitting element array is flush with a surface of the second planarization layer away from the light exiting side of the light emitting element array;
micro-lenses in the micro-lens array correspond to the light emitting elements in the light emitting element array one to one.

4. The display panel according to claim 1, wherein the first planarization layer is made of a transparent epoxy resin material or a heat-conducting silica gel material, and the second planarization layer is made of a transparent polypropylene block polymer material;
a heat conductivity of the epoxy resin material ranges from 0.2 W/(m·K) to 2.2 W/(m·K); a heat conductivity of the heat-conducting silica gel material ranges from 0.8 W/(m·K) to 3.0 W/(m·K); and a heat conductivity of the polypropylene block polymer material ranges from 0.14 W/(m·K) to 0.25 W/(m·K).

5. The display panel according to claim 1, wherein each of the first planarization layer and the second planarization layer is made of a transparent polypropylene block polymer material;
a heat conductivity of the polypropylene block polymer material ranges from 0.14 W/(m·K) to 0.25 W/(m·K).

6. The display panel according to claim 3, wherein each of the micro-lenses comprises a first part and a second part, and the second part covers a side of the first part away from the light exiting side of the light emitting element array;

the second part has a refractive index greater than that of the first part; and the first part has a refractive index greater than 1.

7. The display panel according to claim 6, wherein the first part has a refractive index ranging from 1.4 to 1.6.

8. The display panel according to claim 7, wherein the second part has a refractive index ranging from 1.7 to 2.1.

9. The display panel according to claim 3, further comprising:
a light blocking layer arranged on the second planarization layer and in an interval area between adjacent ones of the quantum dot color filters, and a surface of the light blocking layer away from the light exiting side of the light emitting element array is flush with surfaces of the quantum dot color filters away from the light exiting side of the light emitting element array.

10. The display panel according to claim 3, further comprising: a light blocking layer arranged on the first planarization layer and in an interval region between adjacent ones of the quantum dot color filters, and a surface of the light blocking layer away from the light exiting side of the light emitting element array is flush with surfaces of the quantum dot color filters away from the light exiting side of the light emitting element array.

11. The display panel according to claim 9, further comprising: a protective layer arranged on a side of the quantum dot color filter array away from the light exiting side of light emitting element array, and the protective layer covers the quantum dot color filter array and the light blocking layer.

12. The display panel according to claim 10, further comprising: a protective layer arranged on a side of the quantum dot color filter array away from the light exiting side of light emitting element array, and the protective layer covers the quantum dot color filter array and the light blocking layer.

13. The display panel according to claim 11, further comprising: a color filter layer array and an encapsulation layer, the color filter layer array is arranged on a side of the protective layer away from the light exiting side of the light emitting element array, and color filter layers in the color filter layer array correspond to the light emitting elements in the light emitting element array one to one;
the encapsulation layer is arranged on a side, away from the light exiting side of the light emitting element array, of the color filter layer array, and covers the color filter layer array.

14. The display panel according to claim 12, further comprising: a color filter layer array and an encapsulation layer, the color filter layer array is arranged on a side of the protective layer away from the light exiting side of the light emitting element array, and color filter layers in the color filter layer array correspond to the light emitting elements in the light emitting element array one to one;
the encapsulation layer is arranged on a side, away from the light exiting side of the light emitting element array, of the color filter layer array, and covers the color filter layer array.

15. A display device, comprising the display panel of claim 1.

16. A display panel, comprising a substrate, and a light emitting element array and a quantum dot color filter array on the substrate, the quantum dot color filter array is arranged on a light exiting side of the light emitting element array, and quantum dot color filters in the quantum dot color filter array correspond to light emitting elements in the light emitting element array one to one,
the display panel further comprises a blocking structure arranged between the light emitting element array and the quantum dot color filter array so as to prevent heat dissipated by the light emitting elements from being conducted to the quantum dot color filters,
wherein the blocking structure comprises a first planarization layer and a second planarization layer, the first planarization layer and the second planarization layer are sequentially stacked on the substrate along a light exiting direction of the light emitting element array, the second planarization layer is located on a side of the light emitting element array away from the substrate, and the light emitting element array is embedded in the first planarization layer,
the blocking structure further comprises a micro-lens array embedded in the second planarization layer, a farthest end of the micro-lens array from the light exiting side of the light emitting element array is flushed with a surface of the second planarization layer away from the light exiting side of the light emitting element array, and micro-lenses in the micro-lens array correspond to the light emitting elements in the light emitting element array one to one.

17. A display panel, comprising a substrate, and a light emitting element array and a quantum dot color filter array on the substrate, the quantum dot color filter array is arranged on a light exiting side of the light emitting element array, and quantum dot color filters in the quantum dot color filter array correspond to light emitting elements in the light emitting element array one to one,
the display panel further comprises a blocking structure arranged between the light emitting element array and the quantum dot color filter array so as to prevent heat dissipated by the light emitting elements from being conducted to the quantum dot color filters,
wherein the blocking structure comprises a first planarization layer and a second planarization layer, the first planarization layer and the second planarization layer are sequentially stacked on the substrate along a light exiting direction of the light emitting element array, the second planarization layer is located on a side of the light emitting element array away from the substrate, and the light emitting element array is embedded in the first planarization layer,
the blocking structure further comprises a micro-lens array embedded in the second planarization layer, and micro-lenses in the micro-lens array correspond to the light emitting elements in the light emitting element array one to one,
the display panel further comprises: a light blocking layer arranged in an interval area between adjacent ones of the quantum dot color filters, and a surface of the light blocking layer close to the light exiting side of the light emitting element array is flushed with surfaces of the quantum dot color filters close to the light exiting side of the light emitting element array, or is flushed with a surface of the second planarization layer close to the light exiting side of the light emitting element array.

* * * * *